United States Patent
Sheridan et al.

(10) Patent No.: US 12,185,469 B1
(45) Date of Patent: Dec. 31, 2024

(54) LEAD FRAME AND METHOD FOR STACKING DISCRETE COMPONENTS TO BE EMBEDDED IN SEMICONDUCTOR DEVICE

(71) Applicant: Saras Micro Devices, Inc., Chandler, AZ (US)

(72) Inventors: Richard Sheridan, Gilbert, AZ (US); Imran Khan, Alpharetta, GA (US)

(73) Assignee: SARAS MICRO DEVICES, INC., Chandler, AZ (US)

( * ) Notice: Subject to any disclaimer, the term of this patent is extended or adjusted under 35 U.S.C. 154(b) by 0 days.

(21) Appl. No.: 18/821,747

(22) Filed: Aug. 30, 2024

(51) Int. Cl.
  *H05K 1/18* (2006.01)
  *H01L 49/02* (2006.01)
  *H05K 1/11* (2006.01)
  *H05K 3/30* (2006.01)
  *H05K 3/40* (2006.01)

(52) U.S. Cl.
  CPC .............. *H05K 1/182* (2013.01); *H01L 28/00* (2013.01); *H05K 1/11* (2013.01); *H05K 3/30* (2013.01); *H05K 3/40* (2013.01)

(58) Field of Classification Search
  CPC . H05K 1/182; H05K 1/11; H05K 3/30; H05K 3/40; H01L 28/00
  See application file for complete search history.

(56) References Cited

U.S. PATENT DOCUMENTS

| | | | |
|---|---|---|---|
| 2001/0028544 A1* | 10/2001 | Sano | H01G 9/012 361/301.3 |
| 2010/0188798 A1* | 7/2010 | Togashi | H05K 3/3426 361/306.3 |
| 2013/0146347 A1* | 6/2013 | McConnell | H05K 3/303 361/301.4 |
| 2018/0090420 A1* | 3/2018 | Hata | H01L 23/49589 |
| 2020/0058448 A1* | 2/2020 | Cho | H01G 4/38 |

* cited by examiner

*Primary Examiner* — Peniel M Gumedzoe
(74) *Attorney, Agent, or Firm* — Stetina Brunda Garred & Brucker

(57) ABSTRACT

A method of stacking discrete components to be embedded in a semiconductor device comprises providing a lead frame defining a plurality of strips arranged end-to-end lengthwise with a gap between each pair of adjacent strips, a rail extending parallel to the strips, and a plurality of segments respectively connecting the strips to the rail, placing a plurality of discrete components on the lead frame, each of the discrete components having electrically isolated first and second terminals and being placed so as to bridge the gap between a pair of adjacent strips with the first and second terminals of the discrete component being respectively on one of the pair of adjacent strips and the other of the pair of adjacent strips, removing the rail from the lead frame, and folding the lead frame between the discrete components so as to bring the discrete components into a stacked configuration.

20 Claims, 6 Drawing Sheets

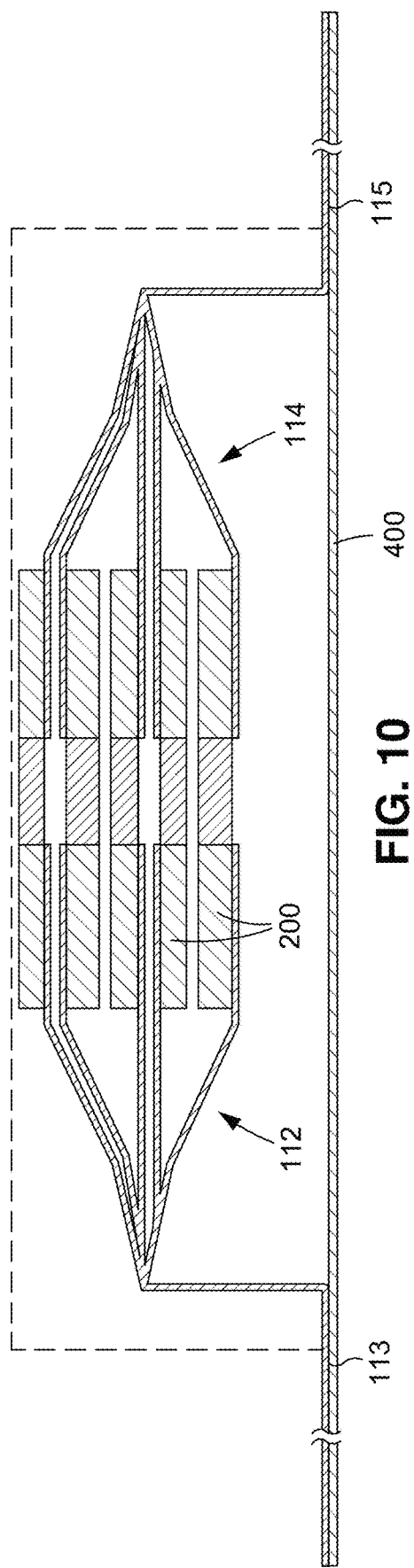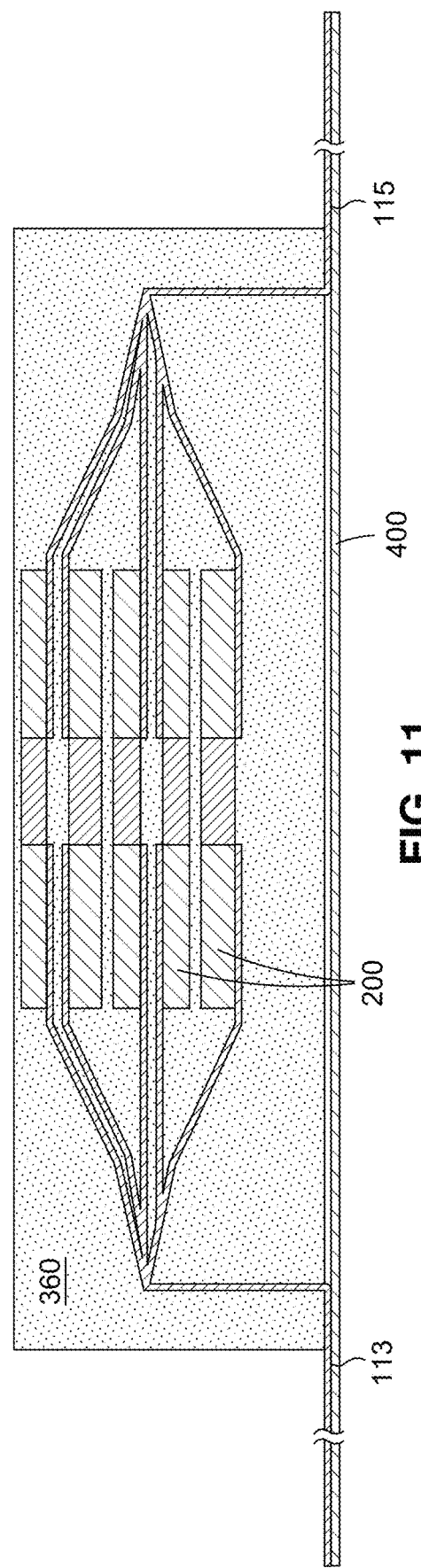

LEAD FRAME AND METHOD FOR STACKING DISCRETE COMPONENTS TO BE EMBEDDED IN SEMICONDUCTOR DEVICE

CROSS-REFERENCE TO RELATED APPLICATIONS

Not Applicable

STATEMENT RE: FEDERALLY SPONSORED RESEARCH/DEVELOPMENT

Not Applicable

BACKGROUND

Stacking of capacitors and other passive devices advantageously reduces the area taken up by the devices on a printed circuit board (PCB) or within a substrate such as a package substrate or interposer of a semiconductor device. In the case of stacked capacitors, the smaller footprint may allow for increased capacitance nearer to the integrated circuit, for example, resulting in shorter conduction paths and reduced equivalent series resistance (ESR) to enable the capacitors to access higher frequencies. Unfortunately, existing processes for stacking individual discrete capacitors and other components are not readily scalable, reducing manufacturing throughput and limiting the cost effectiveness of the benefits that might otherwise be provided.

BRIEF SUMMARY

The present disclosure contemplates various devices and methods for overcoming drawbacks accompanying the related art. One aspect of the embodiments of the present disclosure is a method of stacking discrete components which may thereafter be embedded in a semiconductor device. The method may comprise providing a lead frame defining a plurality of strips arranged end-to-end lengthwise with a gap between each pair of adjacent strips, a first rail extending parallel to the plurality of strips, and a first plurality of segments respectively connecting the plurality of strips to the first rail. The method may further comprise placing a plurality of discrete components on the lead frame, each of the discrete components having electrically isolated first and second terminals and being placed so as to bridge the gap between a pair of adjacent strips with the first and second terminals of the discrete component being respectively on one of the pair of adjacent strips and the other of the pair of adjacent strips. The method may further comprise removing the first rail from the lead frame and folding the lead frame between the discrete components so as to bring the discrete components into a stacked configuration.

The lead frame may define a second rail extending parallel to the plurality of strips on an opposite side of the plurality of strips from the first rail and a second plurality of segments respectively connecting the plurality of strips to the second rail. The method may comprise removing the second rail from the lead frame. The folding may comprise performing a first fold so that a front side of a first of the plurality of discrete components faces a front side of a second of the plurality of discrete components. The folding may comprise performing a second fold in an opposite direction relative to the first fold so that a back side of a third of the plurality of discrete components faces a back side of the second of the plurality of discrete components.

The method may comprise placing the stacked configuration of discrete components in a cavity defined in a substrate such as a package substrate or an interposer of a semiconductor device. The method may comprise filling the cavity with a polymer. The polymer may encapsulate exposed first portions of the strips that are electrically connected to the first terminals of the discrete components and exposed second portions of the strips that are electrically connected to the second terminals of the discrete components. The polymer may be an epoxy resin. The method may comprise forming a via through the encapsulated first portions of the strips that are electrically connected to the first terminals of the discrete components. The method may comprise forming a via through the encapsulated second portions of the strips that are electrically connected to the second terminals of the discrete components.

The method may comprise, after the folding, connecting together exposed first portions of the strips that are electrically connected to the first terminals of the discrete components. The method may comprise, after said folding, connecting together exposed second portions of the strips that are electrically connected to the second terminals of the discrete components. The method may comprise deforming the connected together first portions to produce one or more first outer terminals electrically connected to the first terminals of the discrete components. The method may comprise deforming the connected together second portions to produce one or more second outer terminals electrically connected to the second terminals of the discrete components. The method may comprise encapsulating the stacked configuration of discrete components. The encapsulating may be performed while the stacked configuration is on a carrier. The one or more first outer terminals may include at least two first outer terminals. The method may comprise positioning a first of the at least two first outer terminals on a front side of the encapsulated stacked configuration of discrete components. The method may comprise positioning a second of the at least two first outer terminals on a back side of the encapsulated stacked configuration of discrete components opposite the front side. The one or more second outer terminals may include at least two second outer terminals. The method may comprise positioning a first of the at least two second outer terminals on a front side of the encapsulated stacked configuration of discrete components. The method may comprise positioning a second of the at least two second outer terminals on a back side of the encapsulated stacked configuration of discrete components opposite the front side.

The plurality of discrete components may be capacitors. The first and second terminals may be respective electrodes of each capacitor.

Another aspect of the embodiments of the present disclosure is a method of stacking discrete components to be embedded in a semiconductor device. The method may comprise providing a lead frame and providing a first discrete component having a front side and a back side opposite the front side, the back side of the first discrete component defining electrically isolated first and second terminals of the first discrete component and being attached to the lead frame with the first and second terminals being attached respectively to electrically isolated portions of the lead frame. The method may further comprise providing a second discrete component having a front side and a back side opposite the front side, the second discrete component being stacked on the first discrete component such that the front side of the second discrete component faces the front side of the first discrete component, the back side of the second discrete component defining electrically isolated first and second terminals of the second discrete component and being attached to the lead frame with the first and second terminals being attached respectively to electrically isolated portions of the lead frame. The method may further comprise providing a third discrete component having a front side and a back side opposite the front side, the third discrete component being stacked on the second discrete component such that the back side of the third discrete component faces the back side of the second discrete component, the back side of the third discrete component defining electrically isolated first and second terminals of the third discrete component and being attached to the lead frame with the first and second terminals being attached respectively to electrically isolated portions of the lead frame. The method may further comprise encapsulating the first, second, and third discrete components and at least a portion of the lead frame.

Another aspect of the embodiments of the present disclosure is a device. The device may comprise a lead frame and a first discrete component having a front side and a back side opposite the front side, the back side of the first discrete component defining electrically isolated first and second terminals of the first discrete component and being attached to the lead frame with the first and second terminals being attached respectively to electrically isolated portions of the lead frame. The device may further comprise a second discrete component having a front side and a back side opposite the front side, the second discrete component being stacked on the first discrete component such that the front side of the second discrete component faces the front side of the first discrete component, the back side of the second discrete component defining electrically isolated first and second terminals of the second discrete component and being attached to the lead frame with the first and second terminals being attached respectively to electrically isolated portions of the lead frame. The device may further comprise a third discrete component having a front side and a back side opposite the front side, the third discrete component being stacked on the second discrete component such that the back side of the third discrete component faces the back side of the second discrete component, the back side of the third discrete component defining electrically isolated first and second terminals of the third discrete component and being attached to the lead frame with the first and second terminals being attached respectively to electrically isolated portions of the lead frame.

The first terminals of the first, second, and third discrete components may be attached to respective portions of the lead frame that are electrically connected to each other. The second terminals of the first, second, and third discrete components may likewise be attached to respective portions of the lead frame that are electrically connected to each other.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 10 is a side view of a processing stage of manufacturing a surface mount device;

FIG. 11 is a side view of another processing stage of manufacturing the surface mount device.

DETAILED DESCRIPTION

The present disclosure encompasses various embodiments of methods of stacking discrete components to be embedded in a semiconductor device or surface mounted, along with lead frames used therewith and resulting devices. The detailed description set forth below in connection with the appended drawings is intended as a description of several currently contemplated embodiments and is not intended to represent the only form in which the disclosed subject matter may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
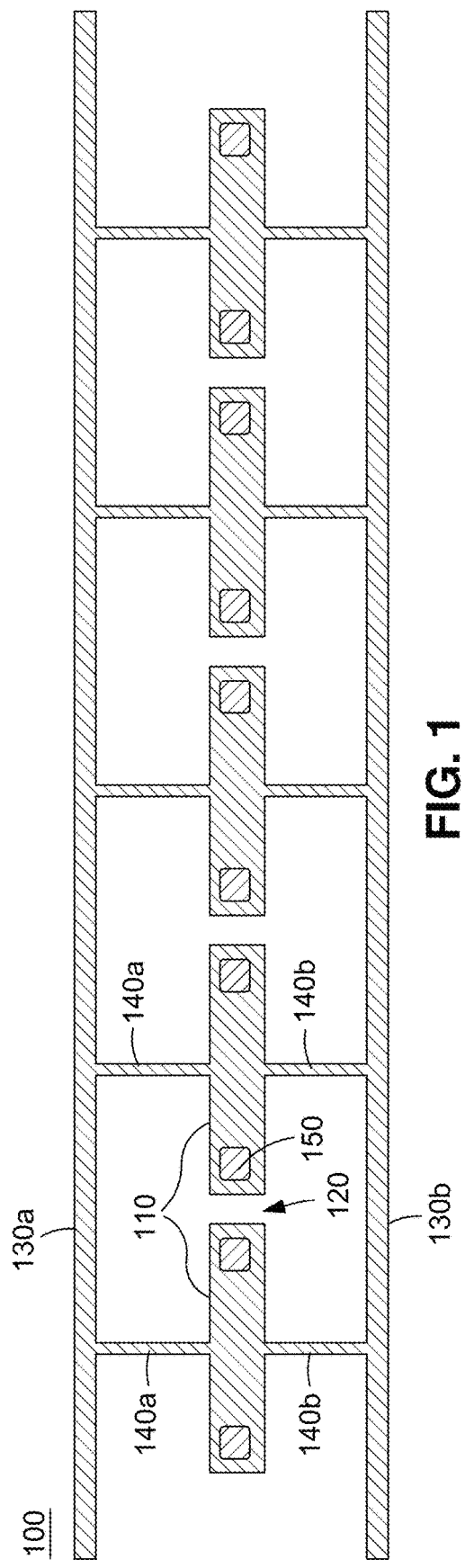
FIG. 1 is a top view of a lead frame.

FIG. 1 is a top view of a lead frame 100 for stacking discrete components 200 (see FIG. 2) according to an embodiment of the present disclosure. The lead frame 100 may comprise a conductive frame made of a single sheet of metal (e.g., copper), which may be designed to be folded over itself to bring the components 200 placed thereon into a stacked configuration. To this end, as shown in FIG. 1, the lead frame 100 may define a plurality of strips 110 arranged end-to-end lengthwise in a first direction (horizontal in FIG. 1) with a gap 120 between each pair of adjacent strips 110 (e.g., in the manner of a dashed line). In another sense, the strips 110 may be disposed sequentially in the first direction with each strip 110 being longitudinally aligned with the others. To support the strips 110, the lead frame 100 may further define a first rail 130a extending parallel to the plurality of strips 110 and a first plurality of segments 140a respectively connecting the plurality of strips 110 to the first rail 130a. Additional support may be provided by a second rail 130b extending parallel to the plurality of strips 110 on an opposite side of the plurality of strips 110 from the first rail 130a and a second plurality of segments 140b respectively connecting the plurality of strips 110 to the second rail 130b. The first and/or second segments 140a, 140b may extend perpendicular to the arrangement direction of the strips 110 as shown (i.e., vertical in FIG. 1) and may extend from a midpoint of each strip 110. The lead frame 100 including the strips 110, first and/or second rail(s) 130a, 130b, and connecting segment(s) 140a, 140b may continue in the first direction indefinitely and may be unwound from a spool in the manner of a tape reel to provide for stacking of an arbitrary number of components 200 as described herein.

Figure 2:
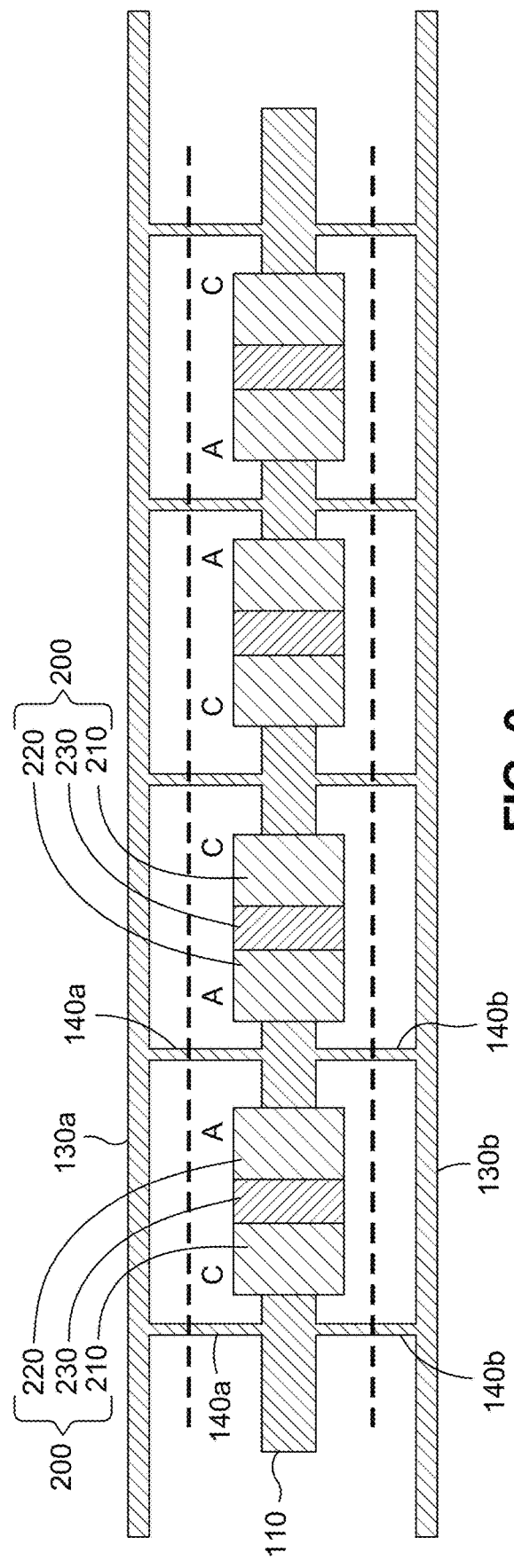
FIG. 2 is a top view of the lead frame with a plurality of discrete components provided thereon.

A method of stacking discrete components 200 may begin with placing a plurality of discrete components 200 on the lead frame 100. (Prior to or during the placement of the discrete components 200, the lead frame 100 may be unwound from a spool to reveal the necessary strips 110 for accommodating the contemplated number of discrete components 200 to be stacked.) Each discrete component 200 may have electrically isolated first and second terminals 210, 220, which may be separated by a dielectric 230. For example, in a case where the discrete components 200 are capacitors, the first and second terminals 210, 220 may be respective cathode and anode terminals (designated "C" and "A" in FIG. 2). Each discrete component 200 may be placed so as to bridge the gap 120 between a pair of adjacent strips 110, with the first and second terminals 210, 220 thereof being respectively on one of the pair of adjacent strips 110 and the other of the pair of adjacent strips 110. As shown in FIGS. 1 and 2, for example, a conductive adhesive 150 (e.g., an ink or paste) may be provided at the ends of each strip 110, and the first terminal 210 (e.g., cathode terminal C) of the discrete component 200 may be adhered to the end of a first strip 110 by the conductive adhesive 150 while the second terminal 220 (e.g., anode terminal A) is adhered to the end of a second strip 110 by the conductive adhesive 150. The dielectric 230 that electrically isolates the first and second terminals 210, 220 within the discrete component 200 may be aligned with the gap 120. In order to effectuate electrical connection between like terminals (e.g., cathode to cathode or anode to anode) in the final stack, the discrete components 200 may be placed alternatingly as shown in FIG. 2 so that a first discrete component 200 is arranged first terminal 210 ("C") then second terminal 220 ("A"), a second discrete component 200 is arranged second terminal 220 ("A") then first terminal 210 ("C"), a third discrete component 200 is arranged first terminal 210 ("C") then second terminal 220 ("A"), and so on, with each conductive strip 110 connecting either the first terminals 210 ("C") of two discrete components 200 or the second terminals 220 ("A") of two discrete components 200.

After placement of the discrete components 200, the first rail 130a may be removed from the lead frame 100 (e.g., discarded or recycled), along with the second rail 130b if included. For example, as depicted with the dashed lines in FIG. 2, the segments 140a, 140b that connect the strips 110 to the rails 130a, 130b may be severed, resulting in the singulated lead frame 100 shown in FIG. 3. In particular, because of the gaps 120 separating the strips 110 (not visible in FIG. 3 because they are underneath the dielectric 230 of each discrete component 200), the removal of the rails 130a, 130b electrically isolates the first terminals 210 ("C") from the second terminals 220 ("A"). After this (or, alternatively, prior to removal of the rails 130a, 130b), the lead frame 100 may then be folded between the discrete components 200 so as to bring the discrete components 200 into a stacked configuration.

Figure 3:
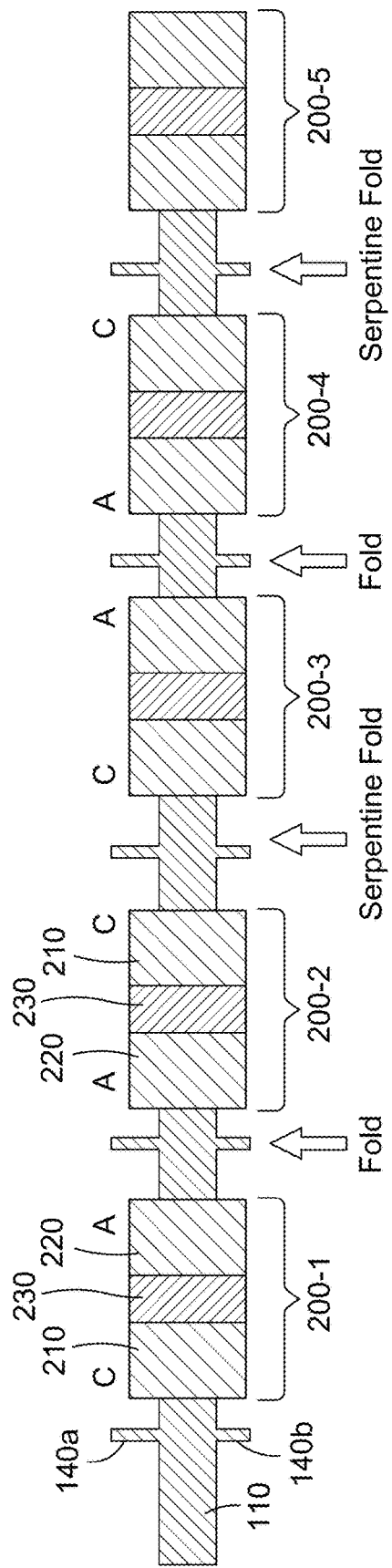
FIG. 3 is a top view of the lead frame and discrete components in another processing stage.
Figure 4:
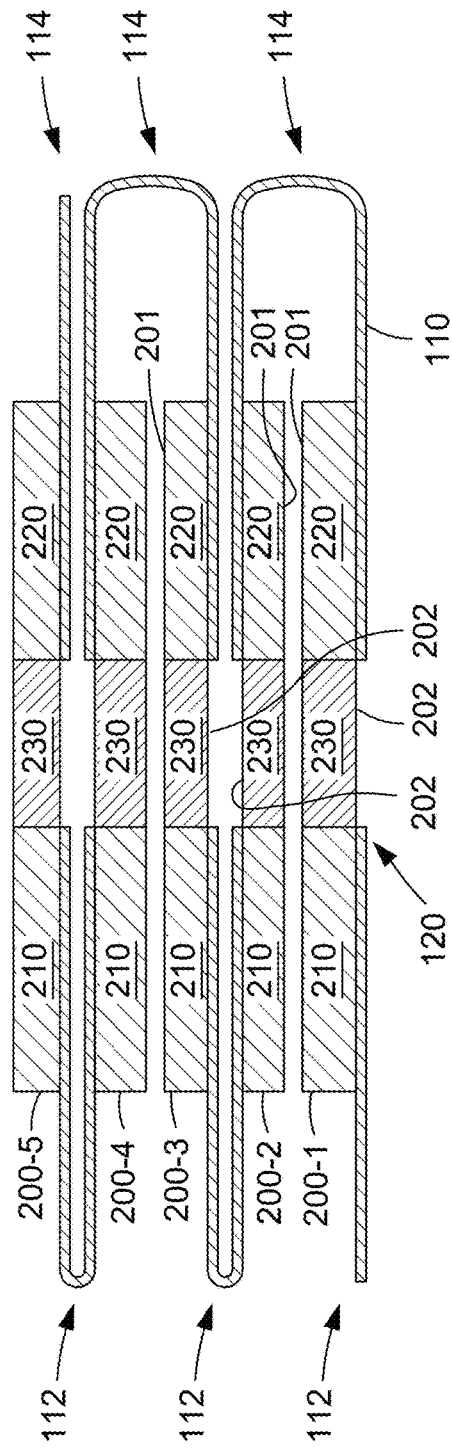
FIG. 4 is a side view of the lead frame and discrete components in a stacked configuration.

An exemplary folding scheme is illustrated in FIGS. 3 and 4, in which the portions of the strips 110 between the discrete components 200 are alternatingly folded and reverse ("serpentine") folded to achieve the stacked configuration. Folding may be performed manually or by a folding or bending machine. For purposes of illustration, five discrete components 200 are shown, numbered 200-1, 200-2, 200-3, 200-4, and 200-5. Folding each strip 110 where indicated in FIG. 3 may result in the stacked configuration shown in FIG. 4. For example, the folding may comprise performing a first fold so that a front side 201 of the first discrete component 200-1 faces a front side 201 of the second discrete component 200-2. In particular, the strip 110 between the first discrete component 200-1 and the second discrete component 200-2 may be folded to bring the second discrete component 200-2 upward and then down again facing the first discrete component 200-1. The folding may further comprise performing a second fold in an opposite direction relative to the first fold so that a back side 202 of the third discrete component 200-3 faces a back side 202 of the second discrete component 200-2. As shown, for example, the strip 110 between the second discrete component 200-2 and the third discrete component 200-3 may be reverse folded to bring the third discrete component 200-3 upward and then down again with its back side 202 facing the back side 202 of the second discrete component 200-2. The folding may continue in this way to bring an arbitrary number of discrete components 200 into a stacked configuration as exemplified in FIG. 4. In particular, the disclosed subject matter may enable efficient stacking of any number of capacitors at low cost, with the resulting capacitive stacks advantageously increasing capacitance density and reducing equivalent series resistance (ESR).

As described in more detail below, the folding processes described herein may result in there being one or more exposed first portions 112 of the strips 110 that are electrically connected to the first terminals 210 of the discrete components 200 as shown in FIG. 4, as well as one or more exposed second portions 114 of the strips 110 that are electrically connected to the second terminals 220 of the discrete components 200. The length of the exposed portions 112, 114 (or leads) may be determined from the length of each strip 110 in the lead frame 100 (as well as the size of each discrete component 200 relative to the length of the strip 110) and may be set as desired.

Figure 5:
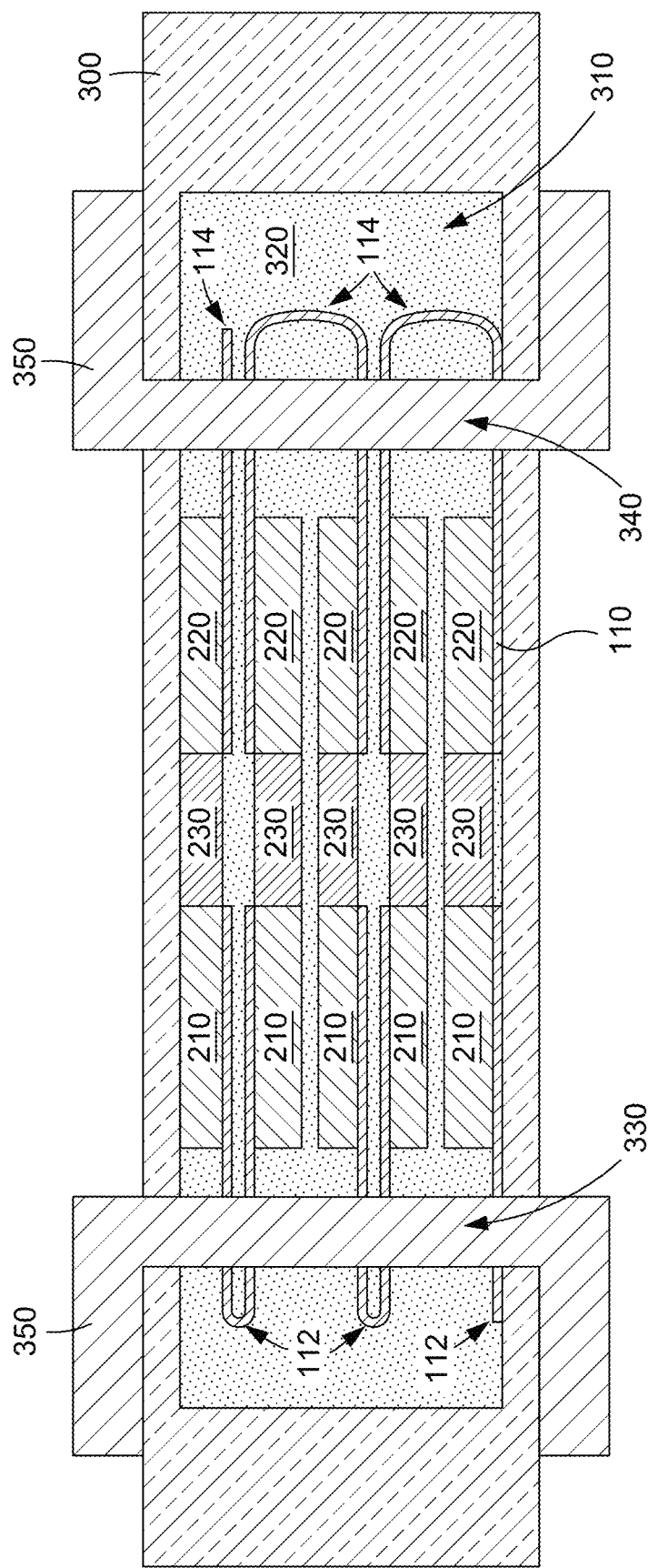
FIG. 5 is a side view of a device made by embedding the lead frame and discrete components in a substrate.
Figure 6:
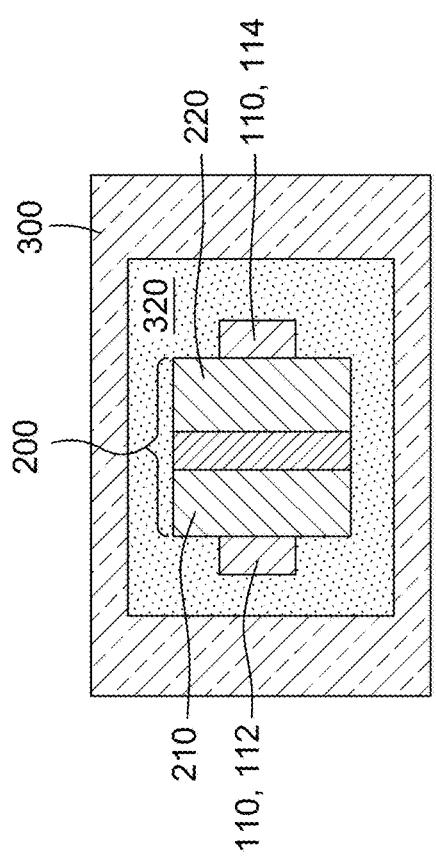
FIG. 6 is a top view of a processing stage of manufacturing the device of FIG. 5.
Figure 7:
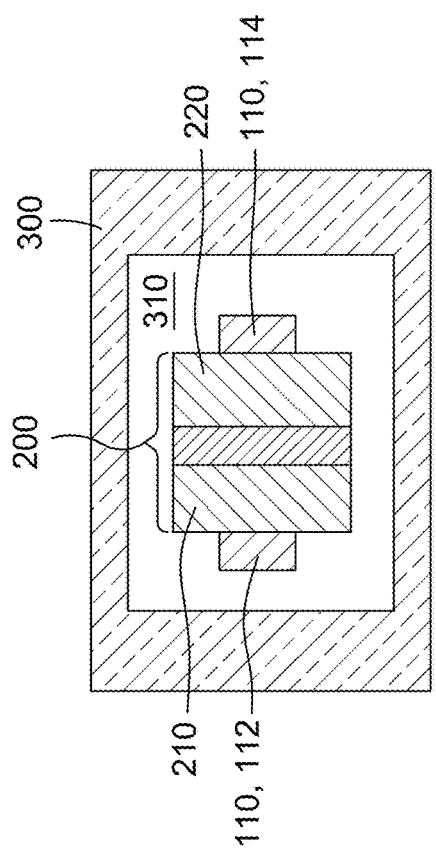
FIG. 7 is a top view of another processing stage of manufacturing the device of FIG. 5.

FIG. 5 shows a device made by embedding the lead frame 100 and stacked discrete components 200 in a substrate 300, which may be a PCB or a package substrate or interposer of a semiconductor device, for example, or other chiplet enabling technologies for semiconductor device applications. Referring to FIGS. 6 and 7, the process may begin with placing the stacked configuration of discrete components 200 (e.g., as shown in FIG. 5) in a cavity 310 defined in the substrate 300. The cavity 310 may be pre-formed in the substrate 300 by laser ablation or etching, for example. The stacked configuration of discrete components 200 may be placed in the illustrated orientation so that the stacking direction is aligned with the normal direction of the substrate 300. In this way, the exposed portions 112, 114 of the lead frame 100 may extend laterally from the stack and may both be accessible from above. The process may continue with filling the cavity 310 with a polymer 320 as shown in FIG. 7. The polymer 320, which may be an epoxy resin, for example, may encapsulate the exposed first portions 112 of the strips 110 that are electrically connected to the first terminals 210 of the discrete components 200 as well as the exposed second portions 114 of the strips 110 that are electrically connected to the second terminals 220 of the discrete components 200.

Figure 9:
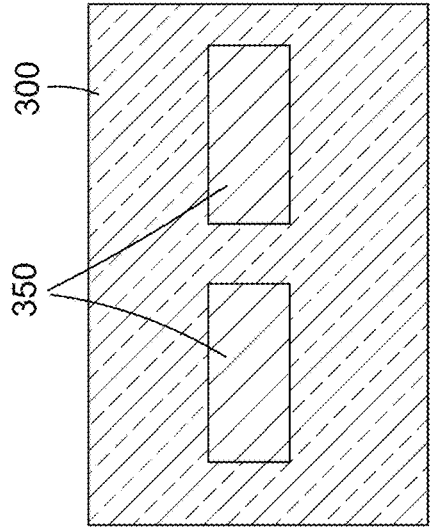
FIG. 9 is a top view of another processing stage of manufacturing the device of FIG. 5.
Figure 8:
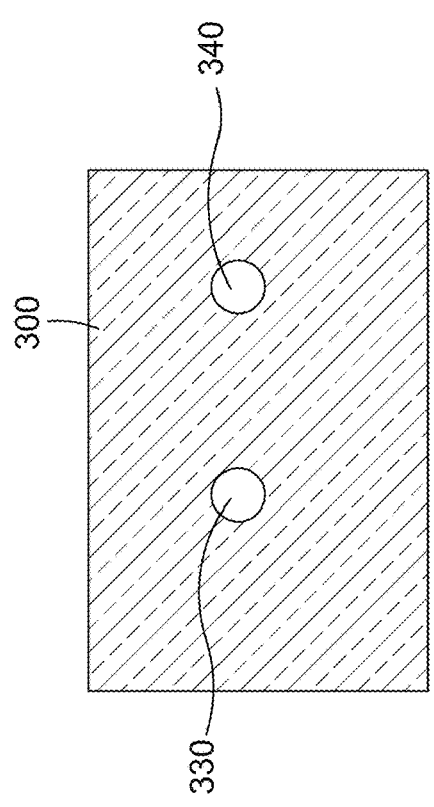
FIG. 8 is a top view of another processing stage of manufacturing the device of FIG. 5.

Referring to FIG. 8, the cavity 310 containing the stack of discrete components 200 and the polymer 320 may then be covered by applying dielectric or laminate to build the substrate 300 above and over the embedded stack. The process may then continue with forming one or more vias 330, 340 to enable access to the stack of discrete components 200 from outside the substrate 300. In particular, a first via 330 may be drilled or otherwise formed through the encapsulated first portions 112 of the strips 110 that are electrically connected to the first terminals 210 of the discrete components 200, and a second via 340 may be formed through the encapsulated second portions 114 of the strips 110 that are electrically connected to the second terminals 220 of the discrete components 200. Referring to FIG. 9 and referring back to the side view of FIG. 5, the vias 330, 340 may be filled with a conductive via fill 350 (e.g., copper) to form pillars/plating and final patterning to connect the terminals 210, 220 of the discrete components 200 to an external circuit. As can be seen in FIG. 5, each of the encapsulated first portions 112 of the strips 110 may be electrically connected together by the via fill 350 of the first via 330, while each of the encapsulated second portions 114 of the strips 110 may likewise be electrically connected together by the via fill 350 of the second via 340, with the resulting plating providing access (from above and/or below the substrate 300) to the combined first terminals 210 (e.g., cathodes) of the discrete components 200 and to the combined second terminals 220 (e.g., anodes) of the discrete components 200.

Figure 12:
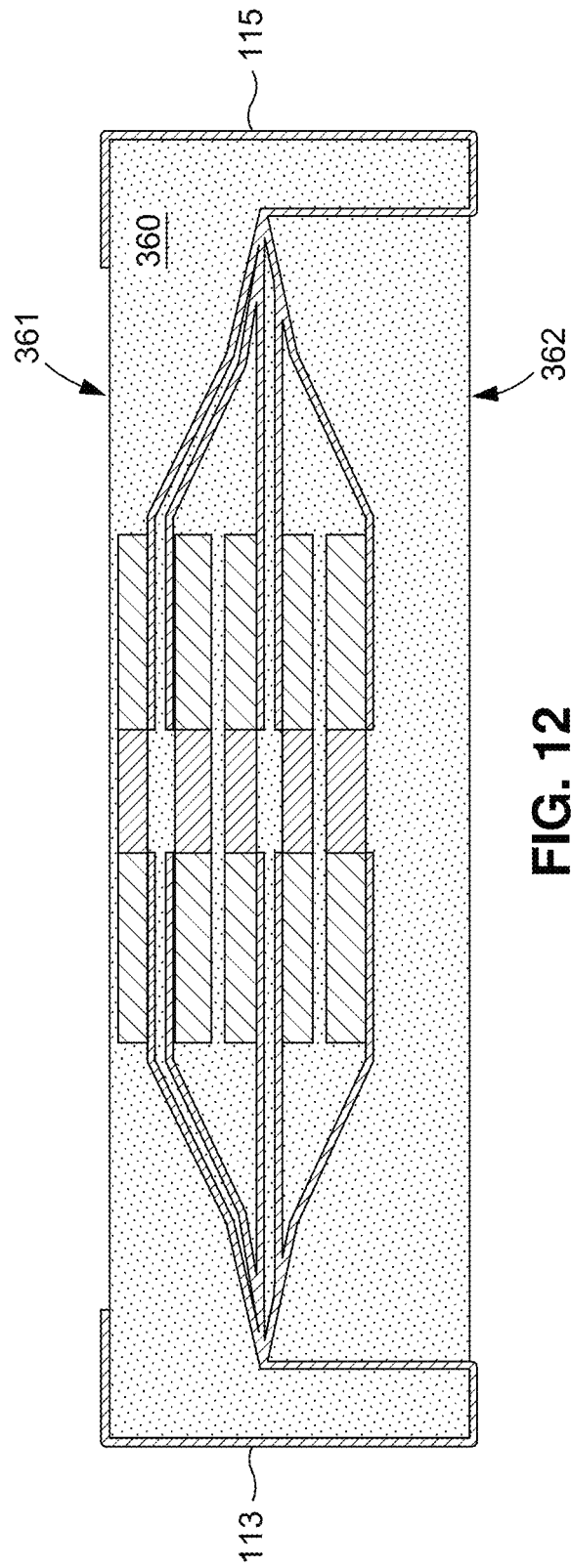
FIG. 12 is a side view of another processing stage of manufacturing the surface mount device.

FIGS. 10-12 show process steps for manufacturing a surface mount device from the stack of discrete components 200. As noted above and illustrated in FIG. 4, there may be one or more exposed first portions 112 of the strips 110 that are electrically connected to the first terminals 210 of the discrete components 200 one or more exposed second portions 114 of the strips 110 that are electrically connected to the second terminals 220 of the discrete components 200. By setting the length of the exposed portions 112, 114 appropriately, the exposed portions 112, 114 may be used to form outer terminals 113, 115 (see FIG. 12) of a surface mount device.

Referring first to FIGS. 10 and 11, after the folding process described above in relation to FIGS. 3 and 4, the manufacturing process may proceed with connecting together the exposed first portions 112 of the strips 110 that are electrically connected to the first terminals 210 of the discrete components 220 and then deforming the connected together first portions 112 to produce one or more first outer terminals 113. Likewise, the exposed second portions 114 of the strips 110 that are electrically connected to the second terminals 220 of the discrete components 200 may be connected together and deformed to produce one or more second outer terminals 115. For example, the first portions 112 (and likewise the second portions 114) may be pinched together and resistance welded, after which the resulting outer terminals 113, 115 or leads may be extended downward and then straight out to the side (laterally) as shown in FIGS. 10 and 11. Extending the leads downward and laterally in this way may allow for the stack to be placed in a raised position as shown, allowing for encapsulant to be filled beneath the stack. In FIGS. 10 and 11, the stack is shown on a carrier 400 (though it is also contemplated that a carrier 400 may not be used) going through a molding machine, where the encapsulant 360 may be applied in a restricted area as shown by the dashed lines in FIG. 10. In FIG. 11, the encapsulant 360 has been applied, leaving exposed only the ends of the leads defining the outer terminals 113, 115. These exposed outer terminals 113, 115 are electrically connected to the first and second terminals 210, 220, respectively, of the discrete components 220 as described above.

Referring to FIG. 12, the exposed leads defining the outer terminals 113, 115 may be bent from below the encapsulant 360 upward and around to the top of the encapsulant 360. In this way, the one or more first outer terminals 113 may be positioned to define at least two first outer terminals, with one being on a front side 361 of the encapsulant 360 and another being on a bottom side 362 of the encapsulant 360 as shown. In the same way, the one or more second outer terminals 115 may be positioned to define at least two second outer terminals, with one being on a front side 361 of the encapsulant 360 and another being on a bottom side 362 of the encapsulant 360 as shown. In this way, the outer terminals 113, 115 may provide access (from above and/or below the substrate encapsulant 360) to the combined first terminals 210 (e.g., cathodes) of the discrete components 200 and to the combined second terminals 220 (e.g., anodes) of the discrete components 200, with no drilling of vias being necessary. The resulting stack of discrete components 200 may be surface mounted to a PCB or may itself be embedded in an integrated passive device (IPD) such as a tile as described in Applicant's own U.S. patent application Ser. No. 18/408,914 ("the '914 application"), filed Jan. 10, 2024 and entitled "Embeddable Tiles Containing Passive Devices for Packaged Semiconductor Devices," the entire contents of which is incorporated by reference herein. The thickness of the IPD may vary and may be increased as long as the leads defining the outer terminals 113, 115 are long enough (which may be determined by length of the strips 110 of the lead frame 100 as described above).

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of stacking discrete components to be embedded in a semiconductor device, the method comprising:
providing a lead frame defining a plurality of strips arranged end-to-end lengthwise with a gap between each pair of adjacent strips, a first rail extending parallel to the plurality of strips, and a first plurality of segments respectively connecting the plurality of strips to the first rail;
placing a plurality of discrete components on the lead frame, each of the discrete components having electrically isolated first and second terminals and being placed so as to bridge the gap between a pair of adjacent strips with the first and second terminals of the discrete component being respectively on one of the pair of adjacent strips and the other of the pair of adjacent strips;
removing the first rail from the lead frame; and
folding the lead frame between the discrete components so as to bring the discrete components into a stacked configuration.

2. The method of claim 1, wherein the lead frame further defines a second rail extending parallel to the plurality of strips on an opposite side of the plurality of strips from the first rail and a second plurality of segments respectively connecting the plurality of strips to the second rail, the method further comprising removing the second rail from the lead frame.

3. The method of claim 1, wherein the folding comprises performing a first fold so that a front side of a first of the plurality of discrete components faces a front side of a second of the plurality of discrete components.

4. The method of claim 3, wherein the folding further comprises performing a second fold in an opposite direction relative to the first fold so that a back side of a third of the plurality of discrete components faces a back side of the second of the plurality of discrete components.

5. The method of claim 1, further comprising placing the stacked configuration of discrete components in a cavity defined in a substrate.

6. The method of claim 5, further comprising filling the cavity with a polymer, wherein the polymer encapsulates exposed first portions of the strips that are electrically connected to the first terminals of the discrete components and exposed second portions of the strips that are electrically connected to the second terminals of the discrete components.

7. The method of claim 6, wherein the polymer is an epoxy resin.

8. The method of claim 6, further comprising forming a via through the encapsulated first portions of the strips that are electrically connected to the first terminals of the discrete components.

9. The method of claim 8, further comprising forming a via through the encapsulated second portions of the strips that are electrically connected to the second terminals of the discrete components.

10. The method of claim 1, further comprising, after said folding, connecting together exposed first portions of the strips that are electrically connected to the first terminals of the discrete components.

11. The method of claim 10, further comprising, after said folding, connecting together exposed second portions of the strips that are electrically connected to the second terminals of the discrete components.

12. The method of claim 11, further comprising:
deforming said connected together first portions to produce one or more first outer terminals electrically connected to the first terminals of the discrete components; and
deforming said connected together second portions to produce one or more second outer terminals electrically connected to the second terminals of the discrete components.

13. The method of claim 12, further comprising encapsulating the stacked configuration of discrete components.

14. The method of claim 13, wherein said encapsulating is performed while the stacked configuration is on a carrier.

15. The method of claim 13, wherein the one or more first outer terminals includes at least two first outer terminals, the method further comprising:
positioning a first of the at least two first outer terminals on a front side of the encapsulated stacked configuration of discrete components; and
positioning a second of the at least two first outer terminals on a back side of the encapsulated stacked configuration of discrete components opposite the front side.

16. The method of claim 15, wherein the one or more second outer terminals includes at least two second outer terminals, the method further comprising:
positioning a first of the at least two second outer terminals on a front side of the encapsulated stacked configuration of discrete components; and
positioning a second of the at least two second outer terminals on a back side of the encapsulated stacked configuration of discrete components opposite the front side.

17. The method of claim 1, wherein the plurality of discrete components are capacitors, and the first and second terminals are respective electrodes of each capacitor.

18. A method of stacking discrete components to be embedded in a semiconductor device, the method comprising:
providing a lead frame;
providing a first discrete component having a front side and a back side opposite the front side, the back side of the first discrete component defining electrically isolated first and second terminals of the first discrete component and being attached to the lead frame with the first and second terminals being attached respectively to electrically isolated portions of the lead frame;
providing a second discrete component having a front side and a back side opposite the front side, the second discrete component being stacked on the first discrete component such that the front side of the second discrete component faces the front side of the first discrete component, the back side of the second discrete component defining electrically isolated first and second terminals of the second discrete component and being attached to the lead frame with the first and second terminals being attached respectively to electrically isolated portions of the lead frame;
providing a third discrete component having a front side and a back side opposite the front side, the third discrete component being stacked on the second discrete component such that the back side of the third discrete component faces the back side of the second discrete component, the back side of the third discrete component defining electrically isolated first and second terminals of the third discrete component and being attached to the lead frame with the first and second terminals being attached respectively to electrically isolated portions of the lead frame; and
encapsulating the first, second, and third discrete components and at least a portion of the lead frame.

19. A device comprising:
a lead frame;
a first discrete component having a front side and a back side opposite the front side, the back side of the first discrete component defining electrically isolated first and second terminals of the first discrete component and being attached to the lead frame with the first and second terminals being attached respectively to electrically isolated portions of the lead frame;
a second discrete component having a front side and a back side opposite the front side, the second discrete component being stacked on the first discrete component such that the front side of the second discrete component faces the front side of the first discrete component, the back side of the second discrete component defining electrically isolated first and second terminals of the second discrete component and being attached to the lead frame with the first and second terminals being attached respectively to electrically isolated portions of the lead frame; and
a third discrete component having a front side and a back side opposite the front side, the third discrete component being stacked on the second discrete component such that the back side of the third discrete component faces the back side of the second discrete component, the back side of the third discrete component defining electrically isolated first and second terminals of the third discrete component and being attached to the lead frame with the first and second terminals being attached respectively to electrically isolated portions of the lead frame.

20. The device of claim 19, wherein the first terminals of the first, second, and third discrete components are attached to respective portions of the lead frame that are electrically connected to each other, and the second terminals of the first, second, and third discrete components are attached to respective portions of the lead frame that are electrically connected to each other.

* * * * *